United States Patent
Buhler et al.

(10) Patent No.: US 7,054,205 B2
(45) Date of Patent: May 30, 2006

(54) CIRCUIT AND METHOD FOR DETERMINING INTEGRATED CIRCUIT PROPAGATION DELAY

(75) Inventors: Douglas C. Buhler, Loveland, CO (US); John Howard Cook, III, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 104 days.

(21) Appl. No.: 10/695,317

(22) Filed: Oct. 28, 2003

(65) Prior Publication Data

US 2005/0088883 A1    Apr. 28, 2005

(51) Int. Cl.
   *H03K 17/296*  (2006.01)
   *G11O 17/28*   (2006.01)
   *H04J 3/06*    (2006.01)
(52) U.S. Cl. .............. 365/194; 365/233; 370/519; 370/517; 370/516; 327/395; 327/400
(58) Field of Classification Search ........... 365/189.12, 365/194, 233; 327/395, 400, 277; 370/508, 370/519, 516, 517
See application file for complete search history.

(56) References Cited

U.S. PATENT DOCUMENTS

| | | | |
|---|---|---|---|
| 3,601,537 A * | 8/1971 | Gueldenpfenning et al. | 375/364 |
| 3,739,160 A * | 6/1973 | El-Hasan et al. | 714/738 |
| 3,997,740 A * | 12/1976 | Eubank et al. | 379/31 |
| 4,177,388 A * | 12/1979 | Lingenfelter | 307/38 |
| 4,251,805 A * | 2/1981 | Holzmann et al. | 341/29 |
| 5,087,828 A * | 2/1992 | Sato et al. | 327/159 |
| 5,245,231 A * | 9/1993 | Kocis et al. | 327/277 |
| 5,465,065 A * | 11/1995 | Stevens | 327/276 |
| 5,534,808 A * | 7/1996 | Takaki et al. | 327/261 |
| 5,744,992 A * | 4/1998 | Baumann | 327/241 |
| 6,680,636 B1 * | 1/2004 | Parry et al. | 327/161 |
| 6,720,811 B1 * | 4/2004 | Yazawa et al. | 327/161 |
| 6,756,833 B1 * | 6/2004 | Miura | 327/277 |

OTHER PUBLICATIONS

Horowitz et al., "The Art of Electronics", Cambridge University Press, 1980, pp. 343-344.*

* cited by examiner

*Primary Examiner*—Van Thu Nguyen
*Assistant Examiner*—J. H. Hur

(57) ABSTRACT

A circuit and method is provided for determining the delay of an integrated circuit common associated with chip-to-chip variations in the manufacturing process, changes in operating voltage, and fluctuations in temperature. A clock signal is inverted, thus generating an inverted clock signal which is then delayed multiple times, resulting in several delayed versions of the inverted clock signal, with each version being delayed a different length of time. The logical state of each delayed version of the inverted clock signal is then stored. That stored logical state provides an indication as to the magnitude of the delay of the integrated circuit which may then be used to tune critical signals of the integrated circuit to avoid timing problems resulting from variations in IC propagation delay.

31 Claims, 6 Drawing Sheets

CIRCUIT AND METHOD FOR DETERMINING INTEGRATED CIRCUIT PROPAGATION DELAY

BACKGROUND OF THE INVENTION

Of all the tasks an integrated circuit (IC) designer faces, resolving timing violations, especially in large, complex IC designs, is one of the most onerous. This task is made difficult, in part, by the fact that IC logic gate delays can vary up to three times in response to changes in power supply voltage, operating temperature, and variations in the IC manufacturing process. Of these three variables, variations in process tend to dominate over changes in voltage and temperature, primarily because changes in the IC process for a particular IC remain constant once that IC has been manufactured. Voltage and temperature, on the other hand are changeable and, to a certain degree, controllable while the IC is operating.

The variations associated with IC process tend to affect a single IC in a more or less uniform manner, so relative differences in speed between multiple logic gates residing on a single IC are not particularly sensitive to those changes. However, input and output signals that couple the IC with other electronic circuits are especially susceptible to IC process variations, as an off-chip circuit with which the IC communicates is not likely to possess the same process variation as the IC. As a result, the relative changes in signal propagation times between the IC and other external circuits tend to be much greater than that between two internal signals of the IC. Such problems are often exacerbated in designs that involve multiple clock domains, in which multiple clocks of different frequencies and phases are utilized.

Currently, a couple of automatic techniques are often employed by IC designers to limit the effects of IC process variations to avoid signal timing problems. For example, an analog phase-locked loop (PLL) or a digital delay-locked loop (DLL) is often used to synchronize IC clock signals with external clock sources to counteract the negative effects of IC process variation. In other situations, process-voltage-temperature (PVT) compensated input/output (I/O) pads for ICs have been utilized to combat the problem. However, circumstances often occur where neither of these techniques is available for a particular IC design, or the techniques cannot fully compensate for exceptional process variations.

Therefore, from the foregoing, a need currently exists for an alternative circuit or method that addresses the inherent problems associated with the manufacturing process variations of an integrated circuit.

SUMMARY OF THE INVENTION

As shown above, automatic compensation techniques are not always effective. Alternately, a more programmatic approach based on a determination of the extent of process variation in a particular IC may be more beneficial. More specifically, by somehow measuring the gate delay of an IC, that information may then be used in software executed on, for example, a microprocessor, to take effective action to counteract the process variation.

Embodiments of the invention, to be discussed in detail below, provide a circuit and method for determining the delay of an integrated circuit associated with chip-to-chip manufacturing process variations, voltage and temperature changes, and the like. First, a clock signal is inverted, thus generating an inverted clock signal, which is then delayed multiple times, resulting in several delayed versions of the inverted clock signal. Each version of the inverted clock signal is delayed a different length of time. The logical state of each delayed version of the inverted clock signal is then stored to provide an indication of the magnitude of the delay of the integrated circuit. Those stored logical states may then be employed to tune one or more critical signals to compensate for the observed propagation delays due to process, temperature, and voltage variations of the IC.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
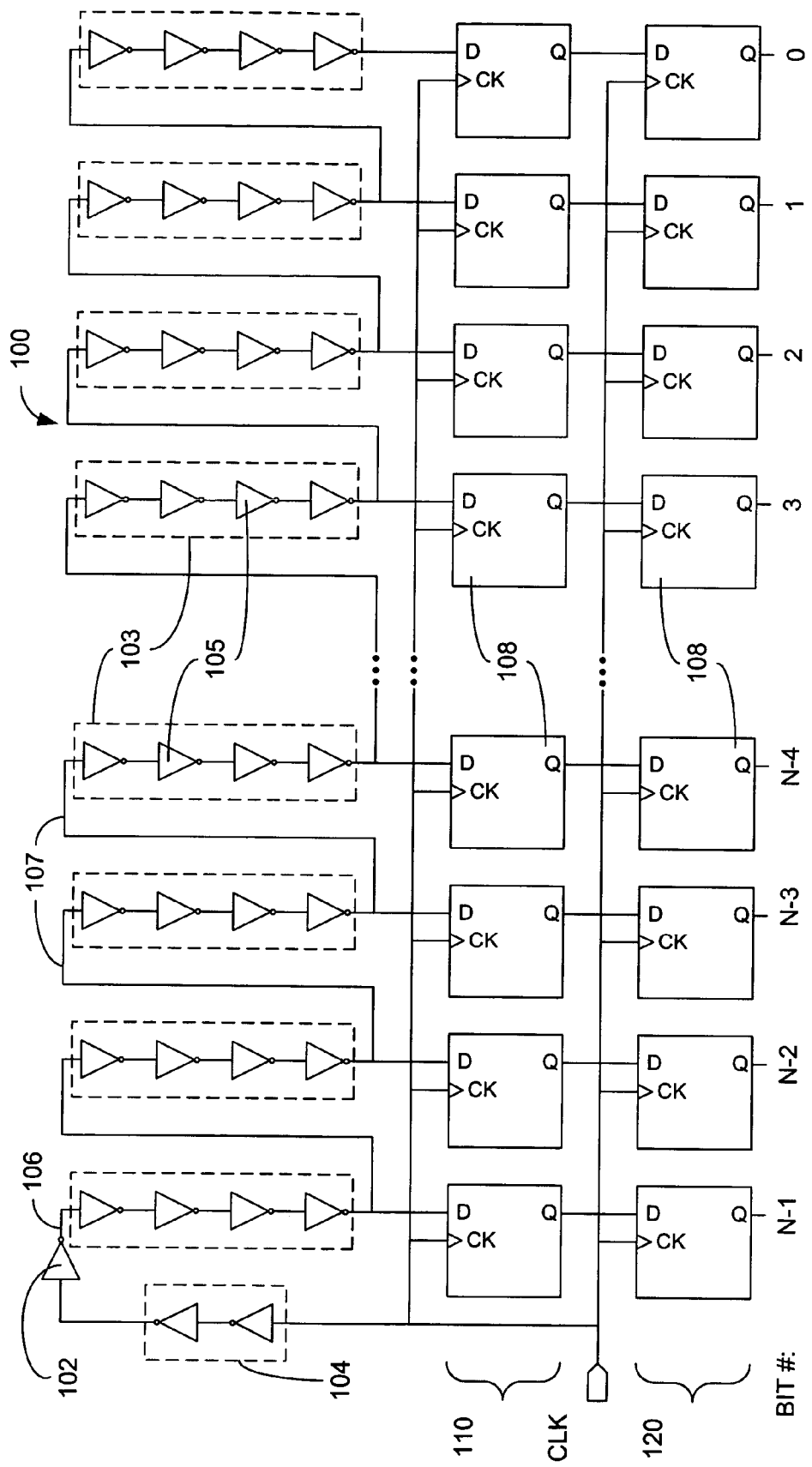
FIG. 1 is a schematic diagram of a circuit according to an embodiment of the invention.

A schematic diagram of a circuit 100 according to an embodiment of the invention for determining IC signal propagation delay is shown in FIG. 1. First, using a clock signal CLK as input for the determining circuit 100, a logic inverter 102 is employed to generate an inverted clock signal 106.

The inverted clock signal 106 is used as a signal to be measured in determining the process-oriented delay of the IC. More specifically, the inverted clock signal 106 is provided as input to a number N of delay units 103 coupled together in a serial fashion. In the specific example of the determining circuit 100 of FIG. 1, each delay unit 103 consists of four inverters 105. An even number of inverters 103 may be used, depending on the particular circumstances involved. Also, other structures, such as delay lines, may be employed to perform essentially the same function. As a result, the output of each delay unit 103 generates a delayed inverted clock signal 107, which drives the next delay unit 103 in the series. Therefore, each delay unit 103 further along the series of delay units 103 produces a slightly more delayed version 107 of the inverted clock signal 106 than the immediately preceding delay unit 103.

In the specific example of FIG. 1, each delay unit 103 employs a substantially identical amount of delay, as evidenced by the equal number of inverters 105 within each unit 103. This structure is especially useful if the circuit propagation delays are linearly associated with variables such as temperature, voltage, and process-oriented variations of the IC. In alternate embodiments, that relationship may not be linear, but may instead be exponential, logarithmic, geometric, or another arithmetic relationship. In such cases, one or more delay units 103 may exhibit different propagation delays from other units 103 to more accurately describe those relationships.

In addition to each delay unit 103, a preliminary delay unit 104 located prior to the series of delay units 103 may also be employed to further delay each delayed inverted clock signal 107 by a uniform amount. This optional use of the preliminary delay unit 104 aids in positioning in time the transitions of the delayed inverted clock signals 107 compared to the original clock signal CLK, the importance of which is described below. The preliminary delay unit 104 may be positioned either before or after the logic inverter 102. As is the case with the delay units 103, the preliminary delay unit 104 may be an even number of inverters 105 (as shown in FIG. 1), delay lines, or some other similar structure.

Each delayed inverted clock signal 107 generated by the delay units 103 drives the data input D of a logic storage element 108 of a first rank 110. Thus, each delay unit 103 has single logic storage element 108 of the first rank 110 with which it is associated. Further, each of the logic storage elements 108 of the first rank 110 is clocked by the original clock signal CLK by way of a clock input CK.

Given that each logic storage element 108 is driven by a slightly different delayed version 107 of the inverted clock signal 106, the possibility of at least one of the logic storage elements 108 of the first rank 110 encountering a timing violation between its delayed inverted clock signal 107 input and the clock signal CLK is not inconsequential. In other words, situations may occur in which the delayed inverted clock signal 107 for a particular logic storage element 108 is in transition between logic LOW and HIGH states at the same time that the clock signal CLK is also in transition. Such a situation may possibly cause the logic storage element 108 in question to become "metastable," which may cause the output of the storage element 108 to oscillate or hover at some voltage level between logic HIGH and LOW for an unacceptable period of time. To help prevent such problems, metastable-resistant flip-flops from the prior art may be employed for the logic storage elements 108 of the first rank 110.

To additionally address a potential metastability problem, a second rank 120 of logic storage elements 108 may be utilized to capture the outputs of the storage elements 108 of the first rank 110. In the specific embodiment of the determining circuit 100 of FIG. 1, the second rank 120 is clocked directly by the clock signal CLK, and the data inputs D are driven by the data outputs Q of the first rank 110 of logic storage elements 108. Alternately, if metastability problems are not anticipated at the data outputs Q of the first rank 110, the second rank 120 of logic storage elements 108 will not be necessary.

In the specific embodiment of FIG. 1, D-type flip-flops are employed as the logic storage elements 108 for both the first rank 110 and the second rank 120. Other types of logic storage elements, such as J-K and S-R flip-flops, may be employed as alternatives.

Figure 2:
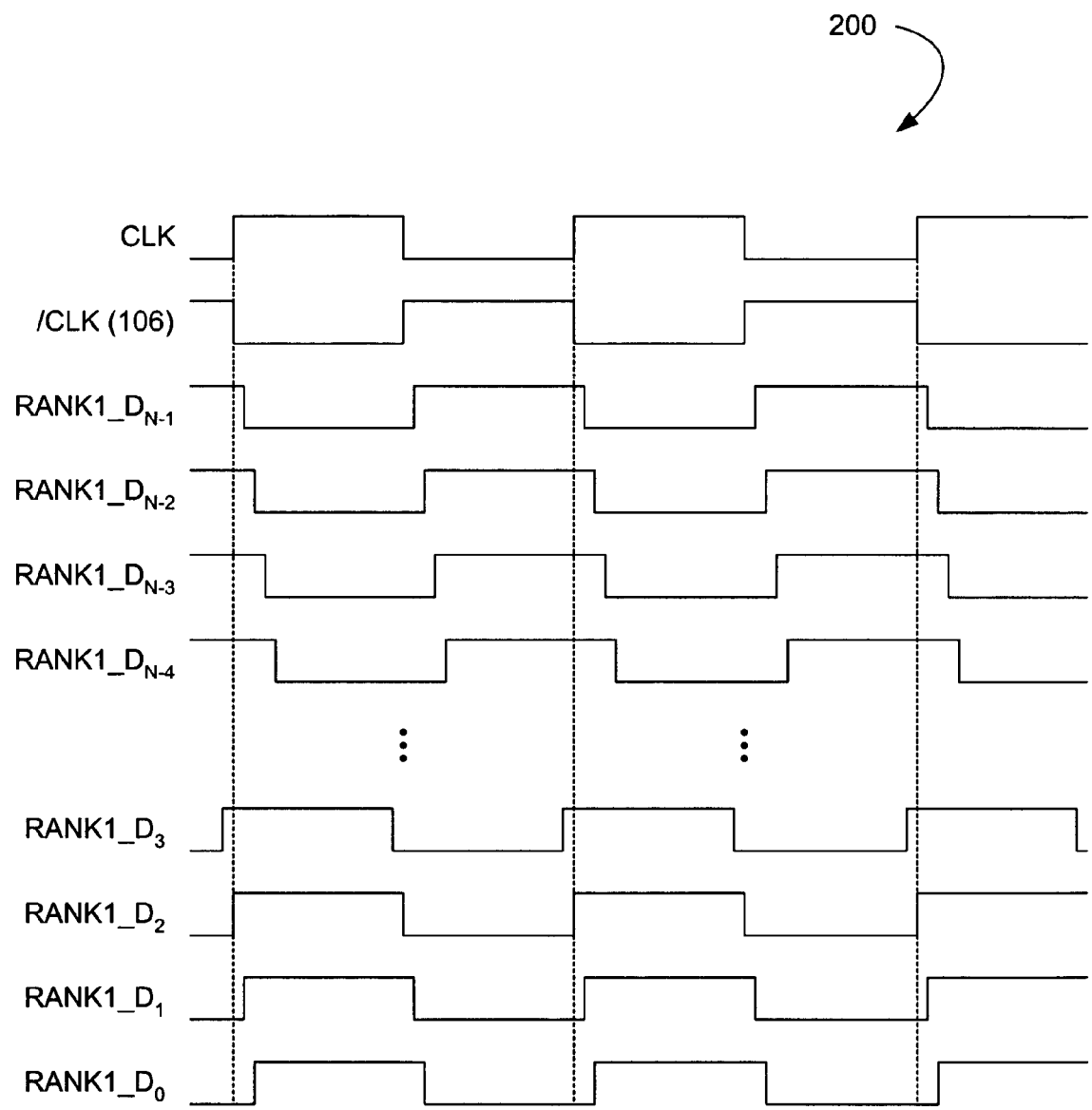
FIG. 2 is an idealized timing diagram of the operation of the circuit of FIG. 1 given an integrated circuit exhibiting a faster-than-nominal propagation delay.
Figure 3:
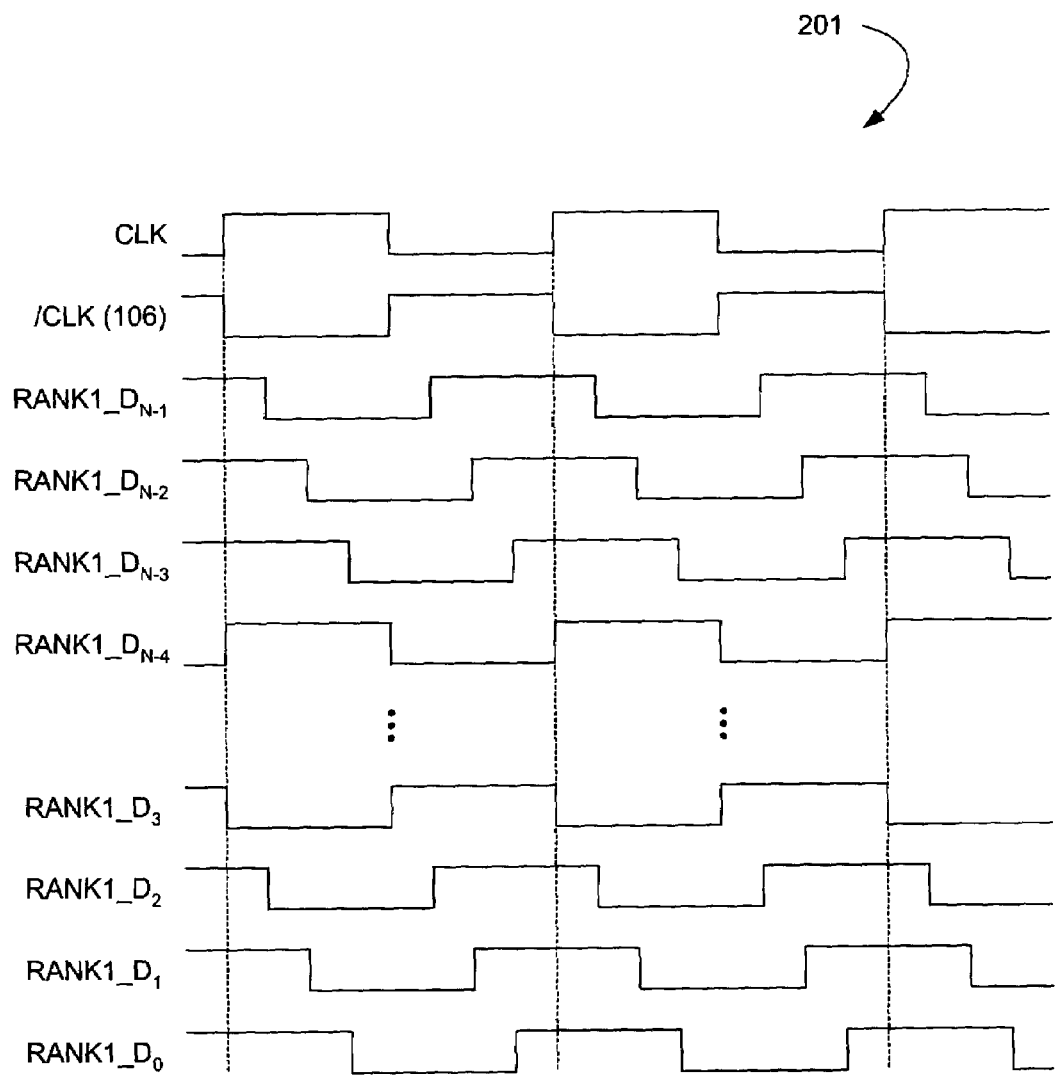
FIG. 3 is an idealized timing diagram of the operation of the circuit of FIG. 1 given an integrated circuit exhibiting a slower-than-nominal propagation delay.

To facilitate discussion of the operation of the determining circuit 100, FIG. 2 and FIG. 3 show by way of timing diagrams how the circuit 100 operates within a faster-than-nominal IC and a slower-than nominal IC. In the fast case 200 shown in FIG. 2, the clock signal CLK and the inverted clock signal 106 (/CLK) are shown. Due to the action of the delay units 103, the state of each succeeding delayed inverted clock signal 107, each of which drives a data input D for each of the N logic storage elements 108 of the first rank 110, is delayed further by each delay unit 103. The waveforms for the data inputs D of the first rank 110 are numbered from $D_{N-1}$ to $D_0$, aligning with the designation of the logic storage elements N-1 through 0 shown in FIG. 1. For an IC that exhibits a comparatively short propagation delay, each delay due to a delay unit 103 is accordingly short. As a result, each delayed inverted clock signal 107 is only delayed slightly compared to the preceding one. In this particular example, the leading edge of the clock signal CLK, shown by the vertical dotted lines of FIG. 2, clocks the logic level at the data inputs D into each logic storage element 108 of the first rank 110. Due to the short propagation delays, a logic HIGH value is clocked into a majority of the logic storage elements 108. Only after the effect of N-2 delay units 103 does the possibility of a logic LOW value being captured (at the data input $D_2$) into a logic storage element 108 of the first rank 110 exist. Assuming $D_2$ is interpreted as LOW, the resulting binary value captured collectively by the first rank 110 would be $D_{N-1} \ldots D_0$=1111 ... 1000. The fact that the first LOW value occurs toward the far right end of the captured data value indicates that the IC involved is faster than a nominally-processed IC.

If a second rank 120 of logic storage elements 108 is employed, as shown in FIG. 1, the values stored in the first rank 110 are available at the outputs of the second rank 120 one pulse of the clock signal CLK later.

FIG. 3 shows a slow case 201 in which a slower-than-nominal IC is involved. Again, the clock signal CLK and the inverted clock signal 106 (/CLK) are shown, along with the several delayed inverted clock signals 107 presented at the data input D of each logic storage element 108 of the first rank 110. However, in this particular case, a slower IC propagation delay results in each successive delayed inverted clock signal 107 being delayed a greater length of time from its predecessor. As a result, the first LOW value captured occurs in this case as early as the data input $D_{N-4}$. Also, as shown in FIG. 3, the later data inputs D may transition back to a logic HIGH. Other transitions may also be exhibited, depending on the number N of logic storage elements 108 residing in the first rank 110. However, the first transition from HIGH to LOW, which is at $D_{N-4}$ in this instance, indicates that the IC propagation delay is longer than what may normally be expected.

Figure 4:
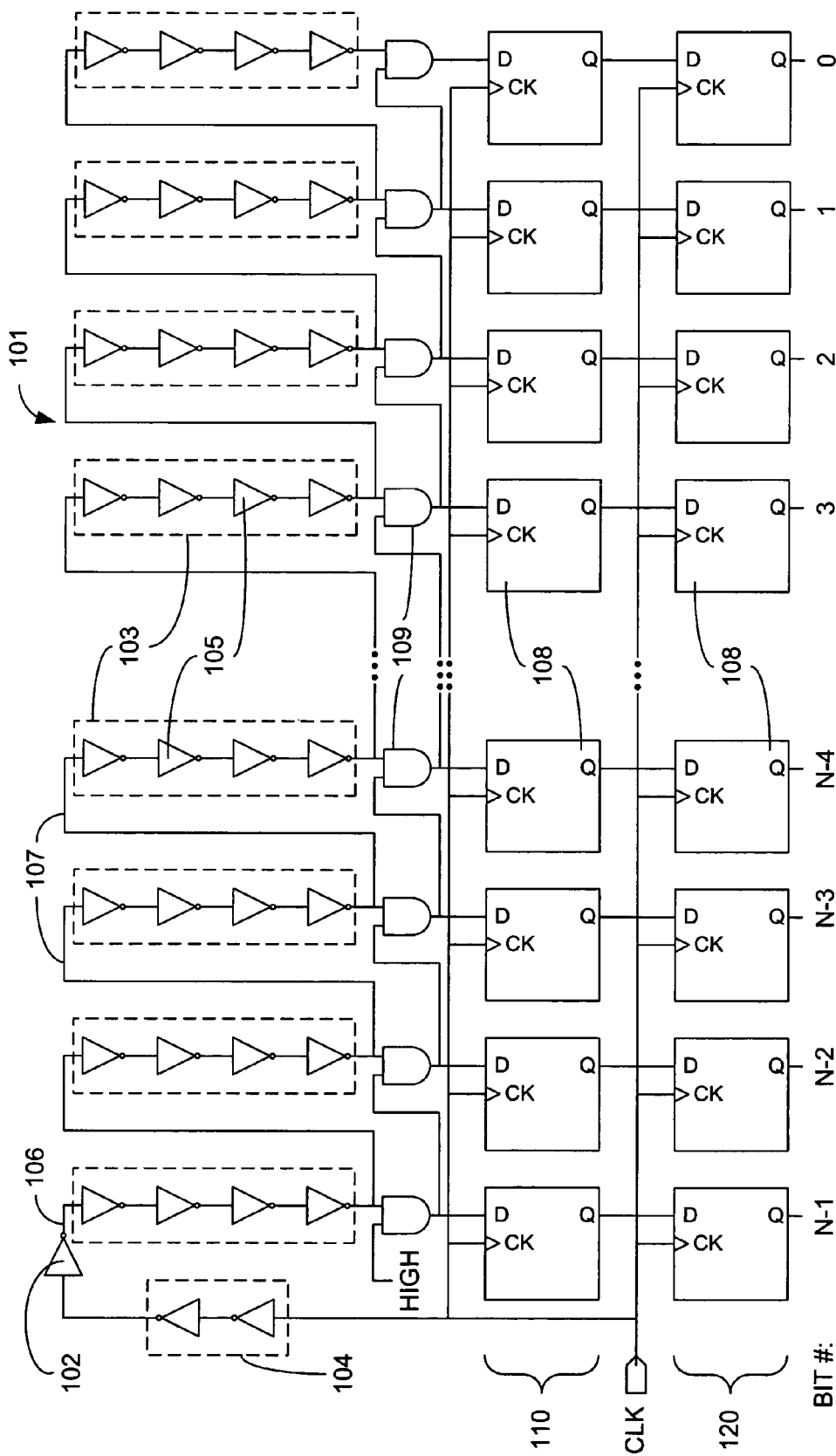
FIG. 4 is a schematic diagram of a circuit according to a second embodiment of the invention.

To eliminate the possibility of multiple transitions in the values captured by the logic storage elements 108 of the first rank 110, a logic AND gate 109 associated with each delay 103 may be employed as shown in the second determining circuit 101 of FIG. 4. The output of each AND gate 109 is configured to drive the data input D of each logic storage element 108 of the first rank 110. The first input of each AND gate is configured to be driven by its associated delay unit 103, while the second input is fashioned to be driven by the output of the AND gate 109 associated with the previous delay unit 103 in the series. For the AND gate associated with the first of the series of delay units 103, the second input is held to a logic HIGH level. Use of the AND gates 109 serves to ensure that a logic LOW value for a delayed inverted clock signal 107 nulls out any potential HIGH logic levels from later delay units 103 in the series. As a result, the values captured by the logic storage elements 108 of the first rank 110 are thus essentially forced to represent a single HIGH-to-LOW transition.

In order for the determining circuit 100, 101 to operate well in all cases, some idea of the possible maximum and minimum propagation delays in the IC is helpful in order to determine an appropriate structure for the delay units 103. More specifically, the number of delay units 103 and, hence, logic storage elements 108, to employ, as well as the delay associated with each delay unit 103, determine the total amount of delay that can be determined. For example, the total delay exhibited by all of the delay units 103 could be selected so that ICs exhibiting the shortest propagation delay would result in a timing violation or value transition from HIGH to LOW somewhere near the far right end of the series of delay units 103 (i.e., near data inputs $D_1$ or $D_0$). Additionally, the determining circuit 100 could also be structured so that ICs with the longest propagation delays would exhibit a HIGH-to-LOW transition as early as $D_{N-1}$ or $D_{N-2}$. Also, the higher the number N of delay units 103, the more resolution in determining the relative propagation delay of the IC. Furthermore, the optional use of the preliminary delay unit 104 also helps determine where a possible timing violation is indicated within the N logic storage elements 108 of the first rank 110.

Furthermore, the determining circuit 100, 101 provides the added potential advantage of determining effects on IC propagation delay due to temperature and voltage variations while the IC is operating. Since the determining circuit 100, 101 does not specifically distinguish between the three identified sources of IC propagation delay variation, the determining circuit 100, 101 may be used to track any changes that occur during IC operation, not just those static propagation delays due to manufacturing process variation.

Figure 5:
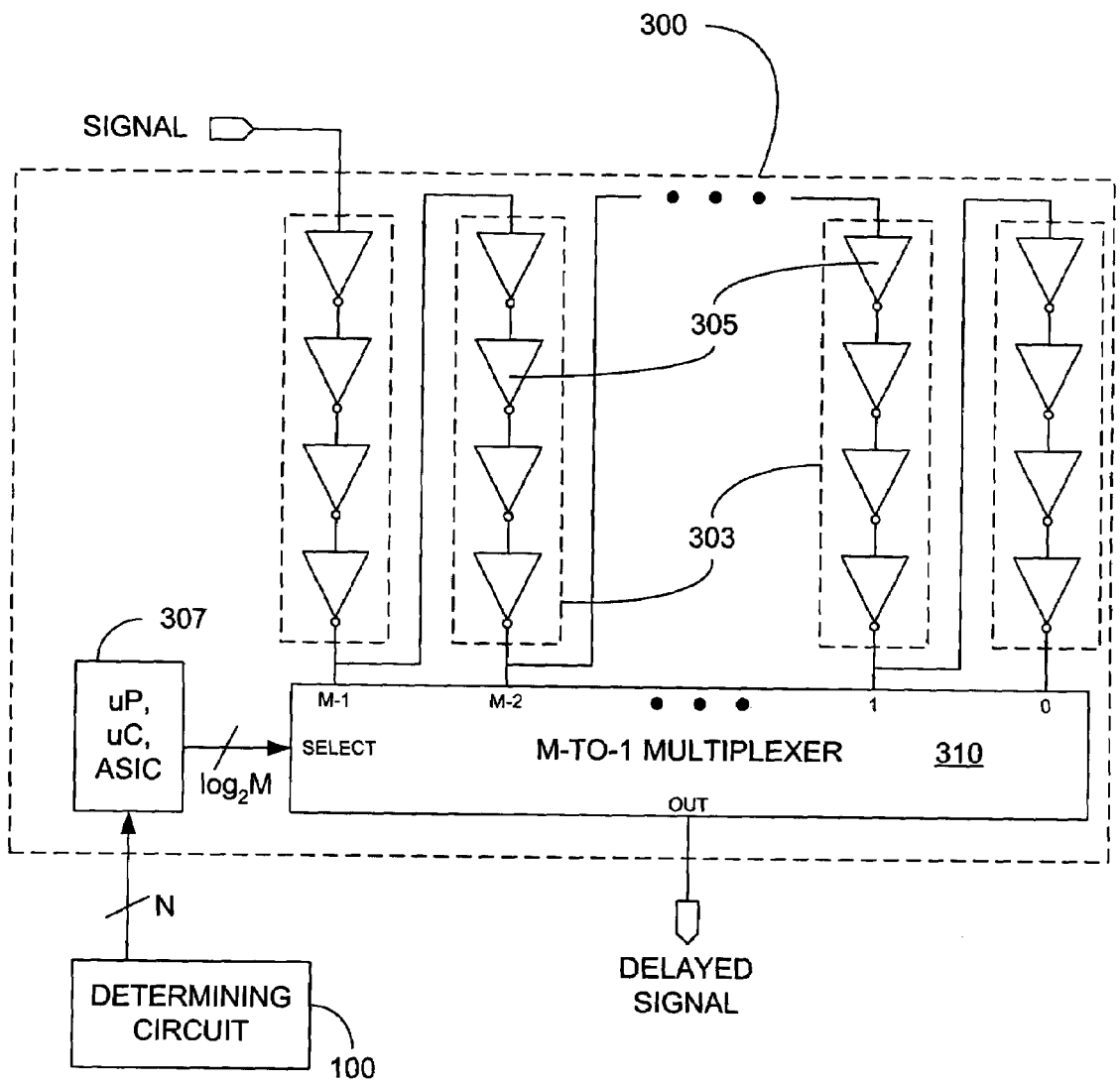
FIG. 5 is a schematic diagram of a circuit according to an embodiment of the invention that may be employed in conjunction with the circuit of FIG. 1 to alter the propagation delay of a signal of the integrated circuit.

The determining circuit 100, 101 may be used in conjunction with a tuning circuit 300, as shown in FIG. 5, that uses the values from the determining circuits 100, 101 to tune the speed of a critical signal SIGNAL, such as a digital clock, typically by way of a programmable delay. For example, a microprocessor, microcontroller, application-specific IC (ASIC), or similar device 307 may be employed to read the outputs of the first rank 110 or second rank 120 of logic storage elements 108 by way of an addressable register, a general purpose port, or similar means. The microprocessor or similar device 307 may then tune the speed of one or more critical signals based on that output value. Similar to the determining circuit 100, 101, the tuning circuit 300 employs M serially-coupled delay units 305, each of which in this case are comprised of several logic inverters 503. The output of each delay unit 305 drives the inputs of an M-to-1 multiplexer 310. As a result, each input of the multiplexer 310 is driven by a delayed version of the critical signal SIGNAL, with each version exhibiting a different propagation delay. One of the delayed versions is selected and transferred to the output DELAYED SIGNAL of the multiplexer 310 by way of $\log_2 M$ selector lines, which may be driven by an addressable register, a general purpose port, or similar means by the microprocessor 307. Thus, a critical signal may be delayed by some programmable amount depending on the overall IC propagation delay as determined by the determining circuit 100, 101, as described earlier.

Figure 6:
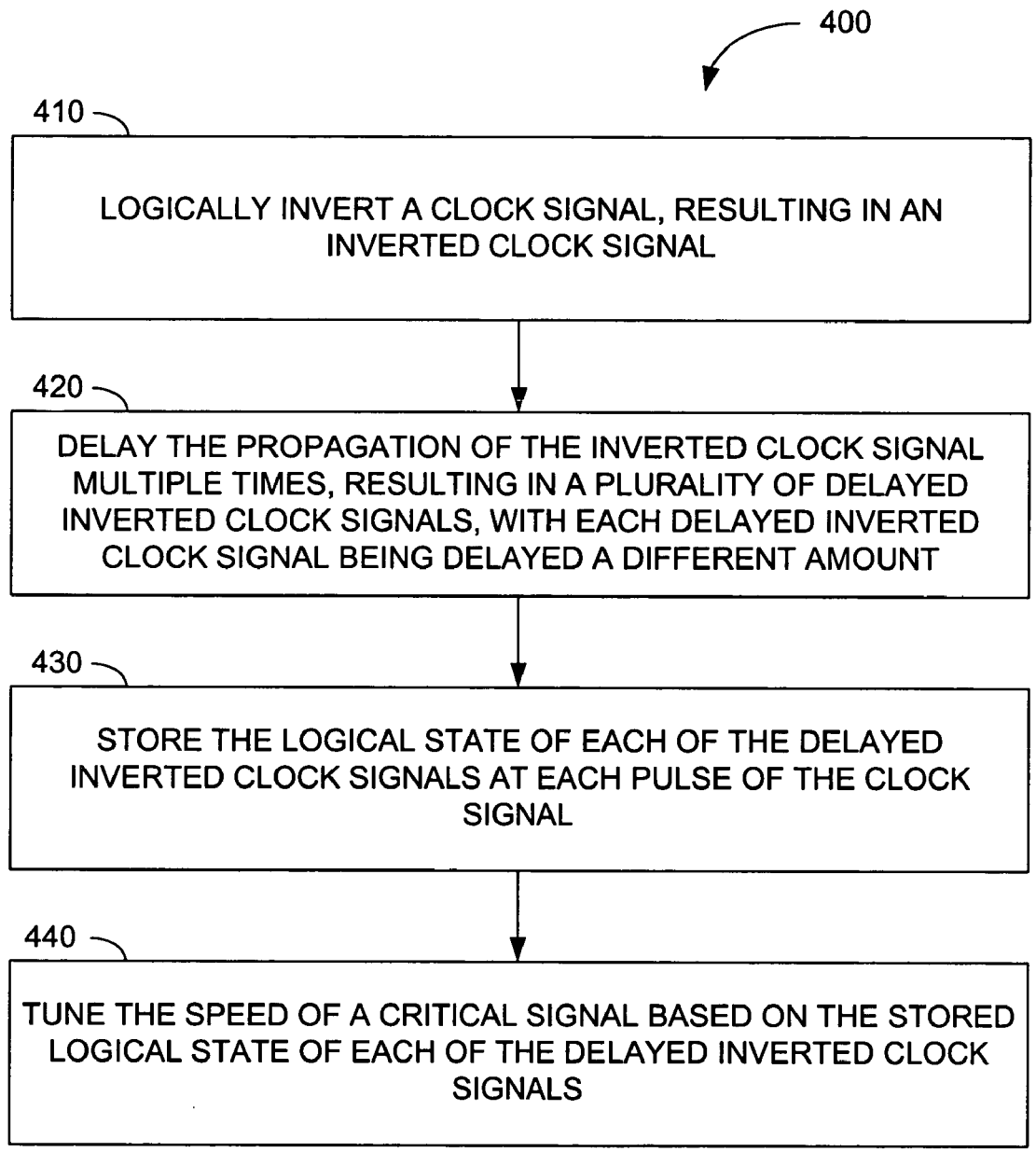
FIG. 6 is a flow chart of a method according to an embodiment of the invention.

The present invention also describes a method 400 for determining the propagation delay of an IC, as displayed in FIG. 6. Generally, a clock signal is logically inverted, resulting in an inverted clock signal (step 410). The propagation of that inverted clock signal is then delayed multiple times, resulting in several delayed inverted clock signals (step 420). Each of the delayed inverted clock signals is delayed a different amount. The logical state of each of the delayed inverted clock signals in then stored for each pulse of the original clock signal (step 430). As a result, the resulting stored states indicate the relative propagation delay of the IC. Optionally, that information may then be used to tune critical signals of the IC (step 440), as described above.

From the foregoing, specific embodiments of the invention provide a circuit and related method for determining the propagation delay associated with an integrated circuit. That circuit and method may then be used to tune critical signals of the IC to avoid timing problems resulting primarily from significant process 25 variations, as well as temperature and voltage changes. Other embodiments of the present invention that are not specifically described herein are also possible. As a result, the invention is not to be limited to the specific forms so described and illustrated; the invention is limited only by the claims.

What is claimed is:

1. A circuit for determining the propagation delay of an integrated circuit, comprising:
    a first rank of logic memory elements, each logic memory element having a data input, a data output, and a clock input, the clock inputs being coupled together and configured to be driven by a clock signal;
    a plurality of delay units coupled in series, each delay unit having an input and an output, the output of each delay unit configured to drive the data input of one of the logic memory elements;
    a plurality of AND gates, each AND gate being associated with one of the series of delay units, each AND gate having an output configured to drive the data input of the logic memory element of the first rank associated with the delay unit associated with the AND gate, each AND gate having a first input configured to be driven by the output of its associated delay unit and a second input configured to be driven by the output of the AND gate associated with the delay unit immediately preceding the delay unit associated with the AND gate, the second input of the AND pate associated with a first delay unit of the series of delay units being configured to be driven by a logic HIGH; and
    a logic inverter having an input configured to be driven by the clock signal, the inverter having an output configured to drive the input of the first delay unit of the plurality of delay units.

2. The circuit of claim 1, wherein each of the plurality of delay units exhibits the same amount of delay.

3. The circuit of claim 1, wherein each delay unit comprises a plurality of logic inverters coupled in series.

4. The circuit of claim 1, wherein each logic memory element of the first rank comprises a D flip-flop.

5. The circuit of claim 1, further comprising a second rank of logic memory elements, each logic memory element of the second rank having a data input, a data output, and a clock input, the clock inputs being coupled together and configured to be driven by the clock signal, the data input of each logic memory element of the second rank configured to be driven by the data output of one of the logic memory elements of the first rank.

6. The circuit of claim 5, wherein each logic memory element of the second rank comprises a D flip-flop.

7. The circuit of claim 1, further comprising a preliminary delay unit configured to delay the clock signal prior to driving the input of the logic inverter.

8. The circuit of claim 1, further comprising a preliminary delay unit configured to delay the output of the logic inverter prior to driving the input of the first delay unit of the plurality of delay units.

9. The circuit of claim 1, further comprising:
    a multiplexer having data inputs, selector inputs, and a data output;
    a second plurality of delay units coupled in series, each delay unit of the second plurality of delay units having an input and an output, the output of each delay unit of the second plurality of delay units configured to drive one of the inputs of the multiplexer; and a microprocessor configured to read the data output of each of the logical memory elements and to select one of the data inputs of the multiplexer via the selector inputs for gating to the output of the multiplexer.

10. The circuit of claim 9, wherein each delay unit of the second plurality of delay units comprises a plurality of logic inverters coupled in series.

11. A circuit for determining the propagation delay of an integrated circuit, comprising:

means for logically inverting a clock signal, resulting in an inverted clock signal;

means for delaying the propagation of the inverted clock signal multiple times, resulting in a plurality of delayed inverted clock signals, with each delayed inverted clock signal being delayed a different amount;

a plurality of means for forming a logical AND function, each logical AND function means being associated with one of the plurality of delayed inverted clock signals, each logical AND function means generating a logical AND signal representing a logical AND of its associated delayed inverted clock signal and the logical AND signal generated by the logical AND function means associated with the immediately preceding delayed inverted clock signal if an immediately preceding delayed inverted clock signal exists; and means for storing the logical state of each of the logical AND signals at each pulse of the clock signal, resulting in a stored logical state for each of the delayed inverted clock signals.

12. The circuit of claim 11, wherein the plurality of delayed inverted clock signals is delayed in a linear fashion.

13. The circuit of claim 11, wherein the inverting means comprises a logic inverter.

14. The circuit of claim 11, further comprising a preliminary delay unit configured to delay the clock signal prior to driving the inverting means.

15. The circuit of claim 11, further comprising a preliminary delay unit configured to delay the inverted clock signal prior to driving the delaying means.

16. The circuit of claim 11, wherein the delaying means comprises a plurality of delay units coupled in series.

17. The circuit of claim 16, wherein each delay unit comprises a plurality of logic inverters coupled in series.

18. The circuit of claim 11, wherein the storing means comprises a first rank of logic memory elements, each logic memory element of the first rank configured to be clocked by the clock signal.

19. The circuit of claim 18, wherein each logic memory element of the first rank comprises a D flip-flop.

20. The circuit of claim 18, wherein the storing means further comprises a second rank of logic memory elements configured to be clocked by the clock signal, the second rank of logic memory elements storing the state of the first rank of logic memory elements.

21. The circuit of claim 20, wherein each logic memory element of the second rank comprises a D flip-flop.

22. The circuit of claim 11, further comprising means for forcing the stored logical state of each of the delayed inverted clock signals to collectively display a single logical transition indicating the propagation delay of the integrated circuit.

23. The circuit of claim 11, further comprising means for tuning the speed of a critical signal based on the stored logical state for each of the delayed inverted clock signals.

24. The circuit of claim 23, wherein the tuning means comprises:

means for delaying the propagation of the critical signal multiple times, resulting in a plurality of delayed critical signals, with each delayed critical signal being delayed a different amount; and means for selecting one of the delayed critical signals.

25. The circuit of claim 24, wherein the delaying means of the tuning means comprises a plurality of delay units coupled in series.

26. The circuit of claim 25, wherein each delay unit of the tuning means comprises a plurality of logic inverters coupled in series.

27. The circuit of claim 24, wherein the selecting means comprises:

a multiplexer configured to gate one of the delayed critical signals for output; and a microprocessor configured to read the logical state of each of the delayed inverted clock signals and to select one of the delayed critical signal for output by way of the multiplexer.

28. A method for determining the propagation delay of an integrated circuit, comprising:

logically inverting a clock signal, resulting in an inverted clock signal;

delaying the propagation of the inverted clock signal multiple times, resulting in a plurality of delayed inverted clock signals, with each delayed inverted clock signal being delayed a different amount;

forming a plurality of logical AND functions, each logical AND function being associated with one of the plurality of delayed inverted clock signals, each logical AND function generating a logical AND signal representing a logical AND of its associated delayed inverted clock signal and the logical AND signal generated by the logical AND function associated with the immediately preceding delayed inverted clock signal if an immediately preceding delayed inverted clock signal exists: and storing the logical state of each of the logical AND signals at each pulse of the clock signal, resulting in a stored logical state for each of the delayed inverted clock signals.

29. The method of claim 28, wherein the plurality of delayed inverted clock signals is delayed in a linear fashion.

30. The method of claim 28, further comprising forcing the stored logical state of each of the delayed inverted clock signals to collectively display a single logical transition indicating the propagation delay of the integrated circuit.

31. The method of claim 28, further comprising tuning the speed of a critical signal based on the stored logical state for each of the delayed inverted clock signals.

* * * * *